(12) United States Patent
Han et al.

(10) Patent No.: US 7,570,341 B2
(45) Date of Patent: Aug. 4, 2009

(54) HEAT-DISSIPATING DISPLAY DEVICE AND METHOD OF MANUFACTURING THEREOF

(75) Inventors: Sang-Sun Han, Yongin-si (KR); Du-Hwan Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 628 days.

(21) Appl. No.: 11/205,514

(22) Filed: Aug. 17, 2005

(65) Prior Publication Data

US 2006/0103774 A1    May 18, 2006

(30) Foreign Application Priority Data

Nov. 16, 2004  (KR) .................... 10-2004-0093635

(51) Int. Cl.
*G02F 1/1333* (2006.01)
*G02F 1/1335* (2006.01)

(52) U.S. Cl. ............................ 349/161; 349/58; 349/61

(58) Field of Classification Search ................ 349/161, 349/61–65, 69, 70, 58
See application file for complete search history.

(56) References Cited

U.S. PATENT DOCUMENTS

| | | | |
|---|---|---|---|
| 5,546,203 A | * | 8/1996 | Takao .......................... 349/62 |
| 6,977,642 B2 | * | 12/2005 | Nagatani ..................... 345/102 |
| 7,324,174 B2 | * | 1/2008 | Hafuka et al. .................. 349/61 |
| 2007/0171353 A1 | * | 7/2007 | Hong .......................... 349/161 |
| 2007/0211205 A1 | * | 9/2007 | Shibata ........................ 349/161 |

FOREIGN PATENT DOCUMENTS

| | | |
|---|---|---|
| CN | 2546911   | 4/2003 |
| CN | 2546911 Y | * 4/2003 |

\* cited by examiner

*Primary Examiner*—Mike Qi
(74) *Attorney, Agent, or Firm*—Cantor Colburn LLP

(57) ABSTRACT

A display device includes a display panel displaying an image, a backlight assembly providing the display panel with light, a receiving container, and a light-blocking member. The backlight assembly includes a light source, an optical sheet disposed over the light source and a light-reflecting sheet disposed under the light source. The receiving container includes a bottom plate having an opening portion, and defines a receiving space for receiving the display panel and the backlight assembly. The light-blocking member is disposed at a backside surface of the light-reflecting sheet. Therefore, heat generated from the light source is easily dissipated through the opening to enhance display quality.

24 Claims, 8 Drawing Sheets

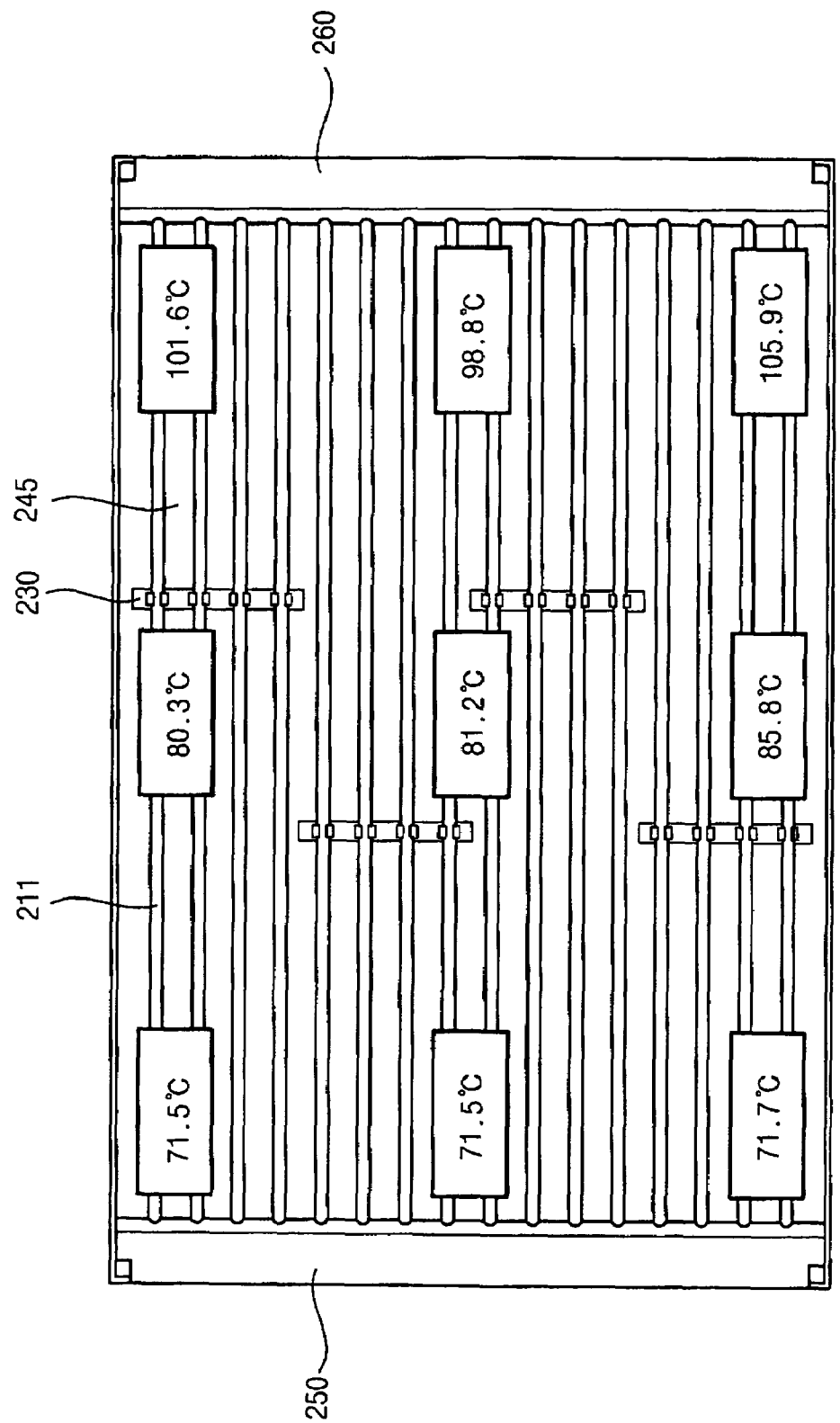

HEAT-DISSIPATING DISPLAY DEVICE AND METHOD OF MANUFACTURING THEREOF

This application claims priority to Korean Patent Application No. 2004-93635, filed on Nov. 16, 2004 and all the benefits accruing therefrom, under 35 U.S.C. §119, and the contents of which in its entirety are herein incorporated by reference.

BACKGROUND OF THE INVENTION

1. Field of the Invention

The present invention relates to a display device. More particularly, the present invention relates to a display device capable of enhancing a display quality.

2. Description of the Related Art

A liquid crystal display ("LCD") device includes an LCD panel and a backlight assembly. The LCD panel displays an image and the backlight assembly provides the LCD panel with light for displaying the image.

The backlight assembly includes a lamp unit, a reflection sheet, and optical sheets. The lamp unit generates light in response to a lamp-driving signal. The reflection sheet is disposed under the lamp unit to reflect light generated by the lamp unit back towards the LCD panel. The optical sheets are disposed over the lamp unit to enhance optical properties of light generated by the lamp unit. A receiving container receives the LCD panel and the backlight assembly.

As a size of the LCD device increases, a direct illumination type LCD device is more frequently used. However, in the direct illumination type LCD device, a liquid crystal layer of the LCD panel is disposed over lamps from the lamp unit of the backlight assembly, so that liquid crystal of the liquid crystal layer becomes deteriorated due to heat generated by the lamps. Such deterioration lowers display quality of the LCD device.

Furthermore, in an edge illumination type LCD device, as in the direct illumination type LCD device, as a size of the receiving container decreases, heat generated by a lamp within the lamp unit may deteriorate display quality of the LCD device due to a reduced distance between the liquid crystal layer and the lamp.

BRIEF SUMMARY OF THE INVENTION

The present invention provides a display device that prevents deterioration of display quality caused by heat generated by a lamp of a backlight assembly.

In exemplary embodiments of a display device, the display device includes a display panel, a backlight assembly, a receiving container and a light-blocking member. The display panel displays an image. The backlight assembly provides the display panel with light. The backlight assembly includes a light source, an optical sheet disposed over the light source and a light-reflecting sheet disposed under the light source. The receiving container includes a bottom plate having an opening portion, and a sidewall extended from edge portion of the bottom plate to define a receiving space for receiving the display panel and backlight assembly. The light-blocking member is disposed at a backside surface of the light-reflecting sheet.

In other exemplary embodiments of a display device, the display device includes a display panel for displaying an image, a backlight assembly including a light source and a light-reflecting sheet, and a receiving container for defining a receiving space for receiving the backlight assembly, the receiving container having a bottom plate. At least the bottom plate includes means for dissipating heat from the light source away from the display panel.

In other exemplary embodiments, a method for protecting a display panel from deterioration due to heat from a light source includes providing a light source within a receiving container, providing an opening portion in the receiving container, wherein heat from the light source passes through the opening portion, placing a board outside the receiving container and adjacent the opening portion, spacing the board from a bottom plate of the receiving container, and convecting heat away from the display panel through a space created between the board and the bottom plate.

Therefore, heat generated from the light source is easily dissipated through the opening to prevent deterioration of the display device and enhance display quality.

BRIEF DESCRIPTION OF THE DRAWINGS

The above and other features and advantages of the present invention will become more apparent by describing in detailed exemplary embodiments thereof with reference to the accompanying drawings, in which:

FIGS. 7A and 7B are plan views illustrating surface temperatures measured on a conventional backlight assembly and a backlight assembly employing an opening portion and a light-blocking member according to exemplary embodiments of the present invention, respectively.

DETAILED DESCRIPTION OF THE INVENTION

Figure 1:
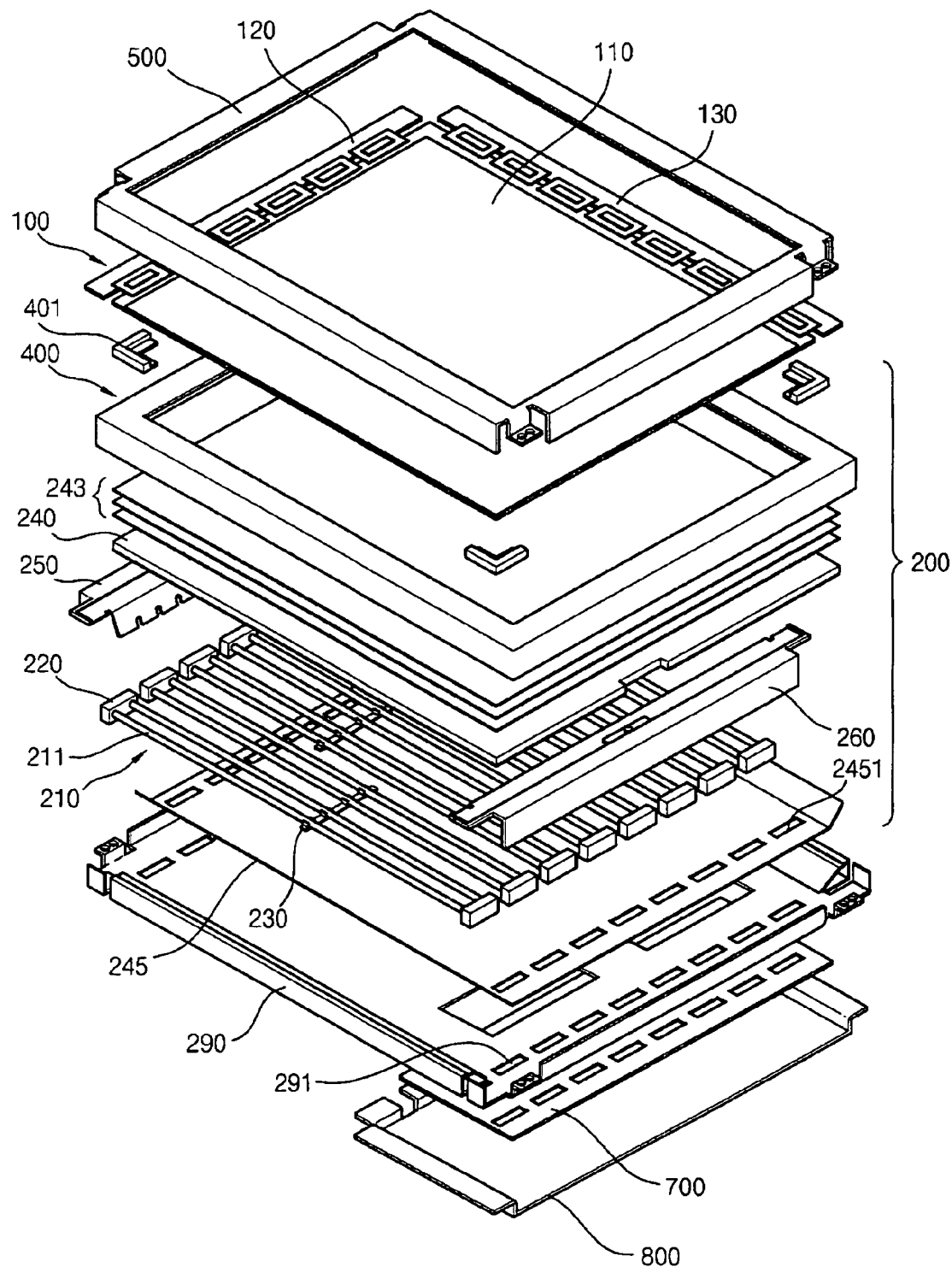
FIG. 1 is an exploded perspective view illustrating an exemplary embodiment of a display device.

It should be understood that the exemplary embodiments of the present invention described below may be varied and modified in many different ways without departing from the inventive principles disclosed herein, and the scope of the present invention is therefore not limited to these particular embodiments. Rather, these embodiments are provided so that this disclosure will be thorough and complete, and will fully convey the concept of the invention to those skilled in the art by way of example and not of limitation.

Hereinafter, the embodiments of the present invention will be described in detail with reference to the accompanying drawings. In the drawings, it should be noted that the thickness of layers, films, and regions may be exaggerated for clarity. Like numerals refer to like elements throughout. It will be understood that when an element such as a layer, film, region, or substrate is referred to as being "on" another element, it can be directly on the other element or intervening elements may also be present.

FIG. 1 is an exploded perspective view illustrating an exemplary embodiment of a display device.

Referring to FIG. 1, a display device includes a display unit 100 for displaying an image by using light, a backlight assembly 200 that provides the display unit 100 with the light, and a receiving container 290 that receives the display unit 100 and the backlight assembly 200.

The display unit 100 includes a display panel 110 for displaying an image, a gate printed circuit board ("PCB") 120 and a data PCB 130 for driving the display panel 110. The display panel 110 includes a first substrate, a second substrate facing the first substrate, and a liquid crystal layer (not shown) disposed between the first and second substrates.

The first substrate of the display panel 110 includes a first transparent substrate and a plurality of thin film transistors ("TFTs") formed on the first transparent substrate. The TFTs are arranged in a matrix shape. Each of the TFTs includes a gate electrode, a source electrode and a drain electrode. Each gate electrode is electrically connected to a gate line. Each source electrode is electrically connected to a source line. Each drain electrode is electrically connected to a pixel electrode. The pixel electrode includes an optically transparent and electrically conductive material such as indium tin oxide ("ITO"), indium zinc oxide ("IZO"), etc.

The second substrate of the display panel 110 faces the first substrate. The second substrate includes a second transparent substrate, a color filter layer, and a common electrode. The color filter layer includes a red color filter, a green color filter, and a blue color filter. The common electrode is formed on the color filter layer. The common electrode includes an optically transparent and electrically conductive material such as indium tin oxide ("ITO"), indium zinc oxide ("IZO"), etc.

When a gate voltage is applied to the gate electrode of the TFT, the TFT is turned on to apply a pixel voltage applied to the source electrode through the source line to the pixel electrode. When the pixel voltage is applied to the pixel electrode, electric fields are generated between the pixel electrode of the first substrate and the common electrode of the second substrate to alter an arrangement of liquid crystal molecules within the liquid crystal layer disposed between the pixel electrode and the common electrode. When an arrangement of the liquid crystal molecules is altered, an optical transmissivity of the liquid crystal layer is changed to display an image. If the liquid crystal layer is deteriorated due to heat from the backlight assembly 200, then the display quality of the display panel 110 will be deleteriously affected.

The backlight assembly 200 includes a lamp unit 210, a lamp holder 220, a light-diffusing plate 240, and optical sheets 243. The lamp unit 210 includes a plurality of lamps 211. The lamp holder 220 holds the lamps 211. The lamp holder 220 may include a first side lamp holder section and a second side lamp holder section, where the first side lamp holder section is positioned adjacent a first side of the backlight assembly 200, and the second side lamp holder section is positioned adjacent a second side of the backlight assembly 200, where the first side is opposite the second side. The first side lamp holder section may hold first ends of one or more lamps 211, and the second side lamp holder section may hold second ends of one or more lamps 211. While each illustrated lamp holder 220 is shown to hold two adjacent lamps 211, alternative arrangements of the lamp holder 220 would also be within the scope of this embodiment. The light-diffusing plate 240 diffuses light generated by the lamps 211. The optical sheets 243 enhance optical properties such as luminance uniformity, viewing angle, etc., as will be further described below.

The lamps 211 have, for example, a straight shape according to FIG. 1, with a longitudinal axis extending from a first end of each lamp 211 to a second end of each lamp 211. Alternatively, the lamps 211 may have a U-shape, where a U-shaped lamp includes two parallel light emitting portions extending generally from the first end to the second end of the backlight assembly 200, and a rounded portion connecting either the first end of the first light emitting portion to the first end of the second light emitting portion, or the second end of the first light emitting portion to the second end of the second light emitting portion. In the embodiment where the lamps 211 have such a U-shape, an alternate arrangement for the lamp holder 220 may be used for the end of the U-shaped lamp corresponding to the rounded portion. By example only, a cold cathode fluorescent lamp ("CCFL") having an electrode formed therein, an external electrode lamp ("EEFL"), etc. may be employed as the lamps 211. A light-emitting diode ("LED") may be also employed as the lamps 211, such as LEDs arranged within stripes, tubes, or bars.

The inverter 700 applies a driving signal to the lamp unit 210. The inverter 700 is formed on a printed circuit board ("PCB"). An inverter-protecting member 800 includes metal to block electromagnetic interference ("EMI").

The lamp holder 220 fixes an end portion of the lamps 211 and combines with the receiving container 290 to fasten the lamps 211 to the receiving container 290. A light-reflecting sheet 245 includes a first combination hole 2451, and the receiving container 290 includes a second combination hole 291 for being combined with the lamp holder 220. In the illustrated embodiment, the first combination hole 2451 and the second combination hole 291 each include a first set of slots extending along a first side of the backlight assembly 200 and a second set of slots extending along a second side of the backlight assembly 200. When assembled, the first and second combination holes 2451, 291 are aligned with the lamp holders 220 such that a portion of each lamp holder 220 may be partially seated within the first and second combination holes 2451, 291.

The light-reflecting sheet 245 is disposed under the lamp unit 210 to reflect light generated by the lamp unit 210 back towards the display panel 110. By "under" the lamp unit 210, it should be understood that the lamp unit 210 has a first surface adjacent to and facing towards the light reflecting sheet 245, and a second surface adjacent to and facing towards the light diffusing plate 240. Thus, the light-reflecting sheet 245 is disposed adjacent to the first surface of the lamp unit 210. The first combination hole 2451 of the light-reflecting sheet 245 is formed at region corresponding to the lamp holder 220, as described above.

A lamp-fixing member 230 fixes the lamps 211 such that the lamps are spaced apart from each other by an equivalent distance. The lamp-fixing member 230 includes a light-diffusing plate fixing portion, that is, a portion of the lamp-fixing member 230 may extend towards the light diffusing plate 240 thus helping to support the light diffusing plate 240 above the lamp unit 210 at a fixed distance. The lamp-fixing member 230 may also include lamp holding portions sized as C-shaped clips, wherein each lamp holding portion may expand to surround each individual lamp 211. The lamp-fixing member 230 may further include a downwardly protruding portion passing through additional combination holes (not shown) formed on the light-reflecting sheet 245, for combining the lamp-fixing member 230 with the receiving container 290.

The backlight assembly 200 further includes a first side-mold frame 250 and a second side-mold frame 260. The first side-mold frame 250 is disposed along the first side of the backlight assembly 200, and the second side-mold frame 260 is disposed along the second side of the backlight assembly 200. The first and second side-mold frames 250 and 260 are combined with the receiving container 290 and cover a first end portion and a second end portion of the lamp unit 210, respectively. For example, the first and second side-mold frames 250, 260 may cover lamp holders 220 or other non-light emitting portions of the lamp unit 210.

The light-diffusing plate 240 and the optical sheets 243 are disposed on the first and second side-mold frames 250 and 260. That is, a first side of the light-diffusing plate 240 and the optical sheets 243 are supported by the first side-mold frame 250, and a second side of the light diffusing plate 240 and the optical sheets 243 are supported by the second side-mold frame 260. At least one of the first and second side-mold frames 250 and 260 further includes a light-diffusing plate fixing portion 252 for fixing the light-diffusing plate 240 and an optical sheet fixing portion 253 for fixing the optical sheets 243, as further shown in FIG. 2. The light-diffusing plate fixing portion 252 secures the light-diffusing plate 240 to the side-mold frame 250 and/or 260, and the optical sheet fixing portion 253 secures the optical sheets 243 to the side-mold frame 250 and/or 260.

The first and second side mold frames 250 and 260 include, for example, a heat dissipation plastic having a thermal conductivity of no less than about 20 W/mK, wherein 'W' represents Watt, 'm' represents miter, and 'K' represent Kelvin. The first and second mold frames 250 and 260 may include, for example, CoolPoly® material by CoolPolymer Inc. as the heat dissipation plastic. Such a family of thermally conductive plastics, and similar materials, offer the heat transfer capability of metals and ceramics with the flexibility of conventional plastics. The thermal conductivity of 'CoolPoly®' material is in a range from about 2 W/mK (similar to glass) and generally from about 10 W/mK to about 100 W/mK (similar to cast Aluminum).

Heat generated by the lamp unit 210 is transferred to the first and second side-mold frames 250 and 260, and the first and second side-mold frames 250 and 260, having the heat dissipation plastic, transfer the heat to the receiving container 290.

The light-diffusing plate 240 diffuses light generated by the lamp unit 210, and the optical sheets 243 enhance optical properties of light that exits the light-diffusing plate 240. The optical sheets 243 include, for example, a diffusing sheet that diffuses light, a prim sheet that enhances front view luminance, a reflective polarization sheet that transmits light having a specific polarization axis, and reflects light having other polarization axis, etc. The optical sheets 243 may include one or more of such exemplary sheets or may include alternate sheets not specifically described herein. Alternatively, the backlight assembly 200 may not include the optical sheets 243.

A middle mold frame 400 is combined with the receiving container 290 to prevent the light-diffusion plate 240 and the optical sheets 243 from drifting relative to the receiving container 290. The middle mold frame 400 includes a substantially planar frame shape, where a first surface of the frame shape faces a top surface of the optical sheets 243 and a second surface of the frame shape faces the display panel 110. The middle mold frame 400 supports the display panel 110, such that the display panel 110 is disposed on the middle mold frame 400. A panel-guiding member 401 is disposed at a corner of the middle mold frame 400 upon the second surface of the frame shape. The panel-guiding member 401 is elastic. Although illustrated as a separate element, the panel-guiding member 401 may alternatively be integrally formed with the middle mold frame 400. The panel-guiding member 401 has an L-shape, and four panel-guiding members 401 are disposed at four corners of the middle mold frame 400, respectively. Other shapes and arrangements of the panel-guiding member 401 would also be within the scope of these embodiments.

The receiving container 290 includes a bottom plate and a sidewall extending upwardly from edges of the bottom plate. The receiving container 290 receives the display panel 110 and the backlight assembly 200. The receiving container 290 includes metal.

A top chassis 500 is combined with the receiving container 290, and fastens the display unit 100 and the backlight assembly 200 to the receiving container 290.

Figure 2:
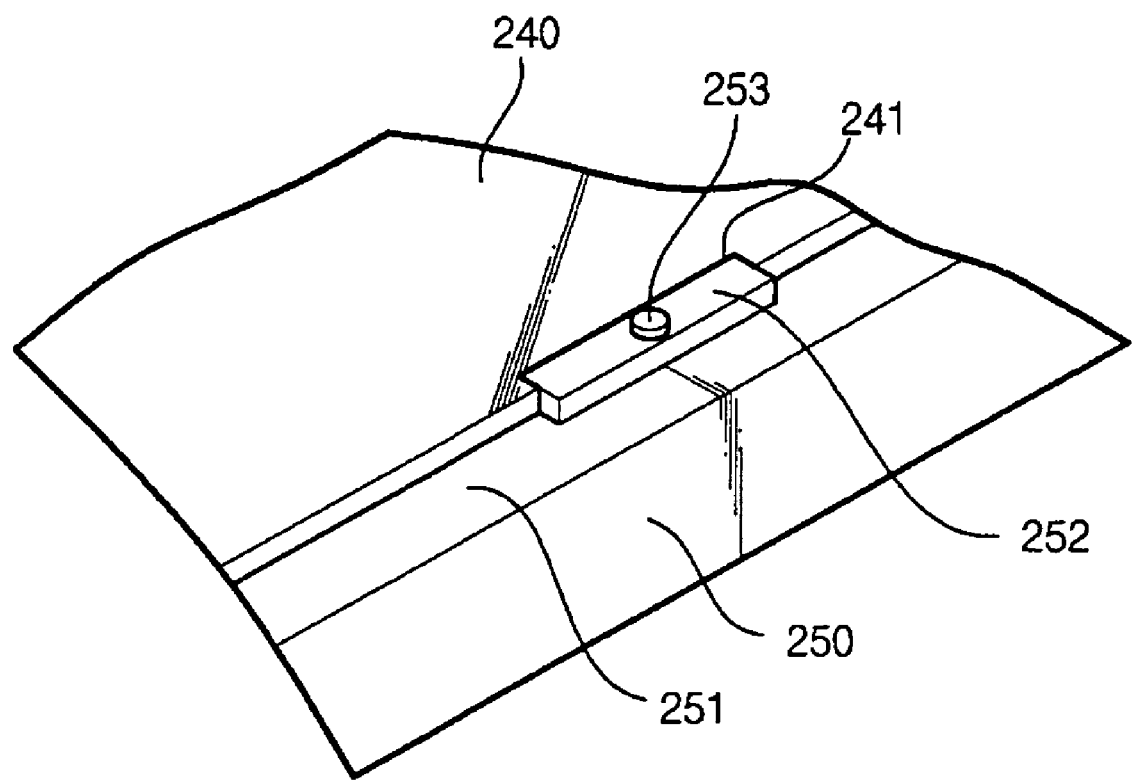
FIG. 2 is an enlarged perspective view illustrating a portion of an exemplary first side-mold frame in FIG. 1.

FIG. 2 is an enlarged perspective view illustrating a portion of a first side-mold frame 250 in FIG. 1.

Referring to FIG. 2, the light-diffusing plate 240 and the optical sheets 243 are disposed on the first side-mold frame 250. The light-diffusing plate 240 includes a first surface facing the lamp unit and a second surface facing the optical sheets 243. A side of the first surface of the light-diffusing plate 240 rests upon the side-mold frames 250 and 260. For convenience, the optical sheets 243 are omitted in FIG. 2.

The light-diffusing plate fixing portion 252 and the optical sheet-fixing portion 253 are disposed at a top surface, a surface facing the first surface of the light-diffusing plate 240, of the first side-mold frame 250. In detail, the light-diffusing plate fixing portion 252 is protruded upwardly from the top surface of the first side-mold frame 250 and inserted into a recessed portion 241 of the light-diffusing plate 240 to prevent drifting of the light-diffusing plate 240. The recessed portion 241 may be a rectangular shaped indentation extending into a first side of the light-diffusing plate 240, where the rectangular shaped indentation matches a shape of the light-diffusing plate fixing portion 252. While the illustrated embodiment shows a rectangular shaped indentation for the recessed portion 241, the recessed portion 241 may include other shapes that correspond to an alternately shaped light-diffusing plate fixing portion 252, such as, but not limited to, jagged sides, curved sides, etc. The optical sheet-fixing portion 253 is disposed on the light-diffusing plate fixing portion 252. Alternatively, the optical sheet-fixing portion 253 may be formed on the top surface 251 of the first side-mold frame 250. In either case, the optical sheets 243 may include an opening that, when assembled upon the light diffusing plate 240 and the side-mold frames 250 and 260, will align with the optical sheet-fixing portion 253 thereby preventing the optical sheets 243 from shifting relative to the first and second side-mold frames 250, 260.

Figure 3:
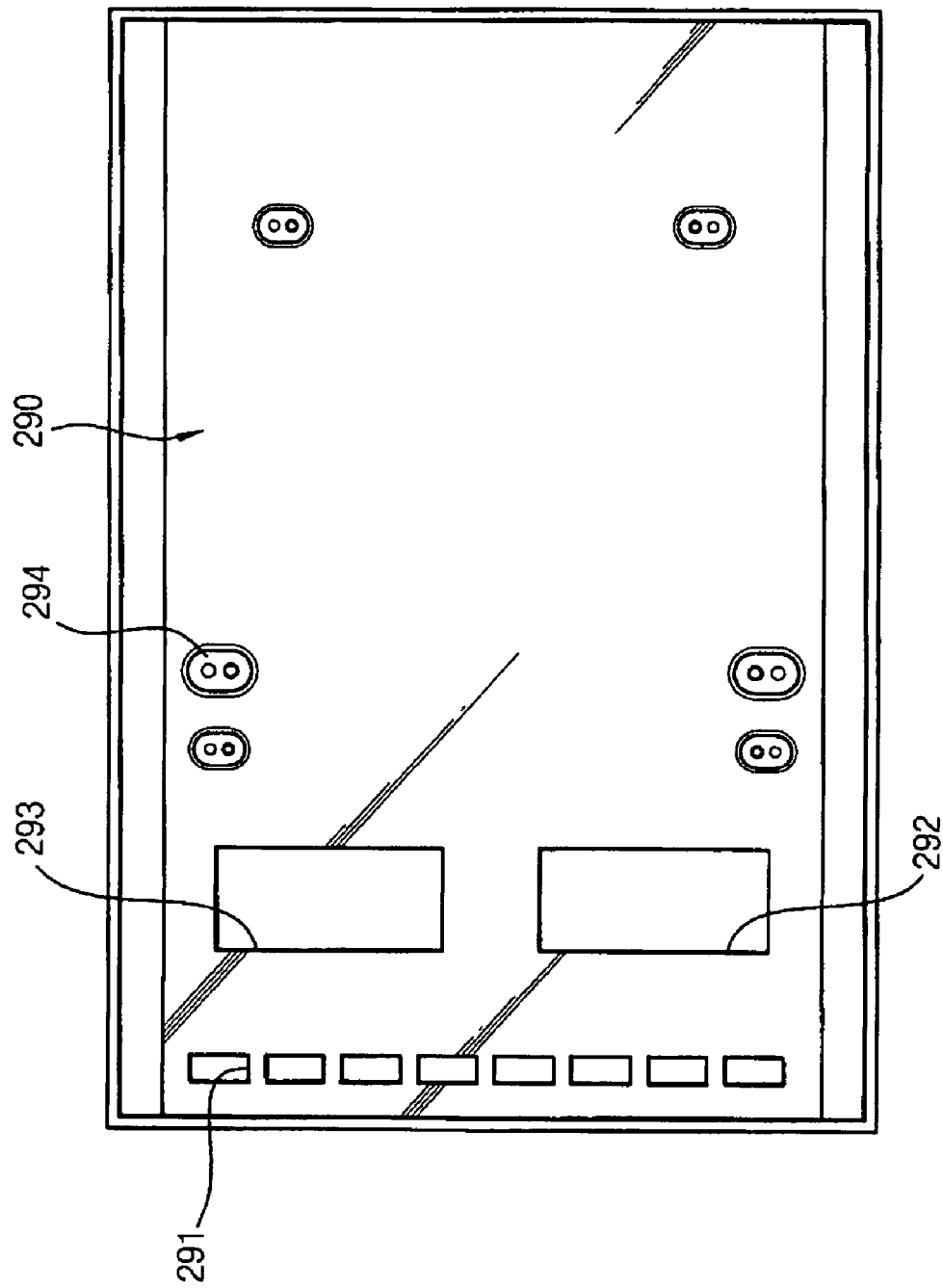
FIG. 3 is a plan view illustrating a backside of an exemplary receiving container in FIG. 1.

FIG. 3 is a plan view illustrating a backside of a receiving container 290 in FIG. 1.

Referring to FIGS. 1 and 3, the receiving container 290 includes metal. The receiving container 290 includes the bottom plate and the sidewall extending upwardly from edge portions of the bottom plate. The receiving container 290 receives the display panel 110 and the backlight assembly 200 within a receiving space created by the bottom plate and the sidewall.

The bottom plate of the receiving container 290 includes a second combination hole 291 to be combined with the first combination hole 2451 of the light reflecting sheet 245 and the lamp holder 220, as previously described.

The bottom plate further includes opening portions 292 and 293 to dissipate heat generated by the lamp unit 210. When the inverter 700 is spaced apart from the receiving container 290 (or when a gap is defined between the inverter 700 and the receiving container 290), heat may be dissipated more rapidly due to convection, which is the transfer of heat within a fluid, e.g. air. The heat dissipation is due to motion of the fluid created by temperature differences existing within the fluid. Depending on the orientation of the display, after heat exits the receiving container 290, the heated air will continue to move within the space created between the inverter 700 and the receiving container 290, in a direction opposite of gravity and/or in a lateral direction until it is exterior of the backlight assembly 200 for rising freely. Therefore, the opening portions 292 and 293 are formed on a portion of the bottom plate, which corresponds to a location of the inverter 700 when the display apparatus is assembled. While the illustrated embodiment demonstrates two opening portions 292, 293, more or less openings may be formed within the bottom plate of the receiving container 290, where such more or less openings have a location corresponding to a location of the inverter 700 when the display apparatus is assembled. For example, one opening, having a larger area than the two opening portions 292, 293 may be provided. Alternatively, three or more opening portions may be provided, where each opening portion has a smaller area than each of the opening portions 292, 293.

Additionally, a protruding portion 294 for fixing the inverter 700 and the inverter-protecting member 800 relative to the receiving container 290 is formed at a backside of the bottom plate of the receiving container 290. The protruding portion 294 will be described in greater detail below with reference to FIG. 5.

Figure 4:
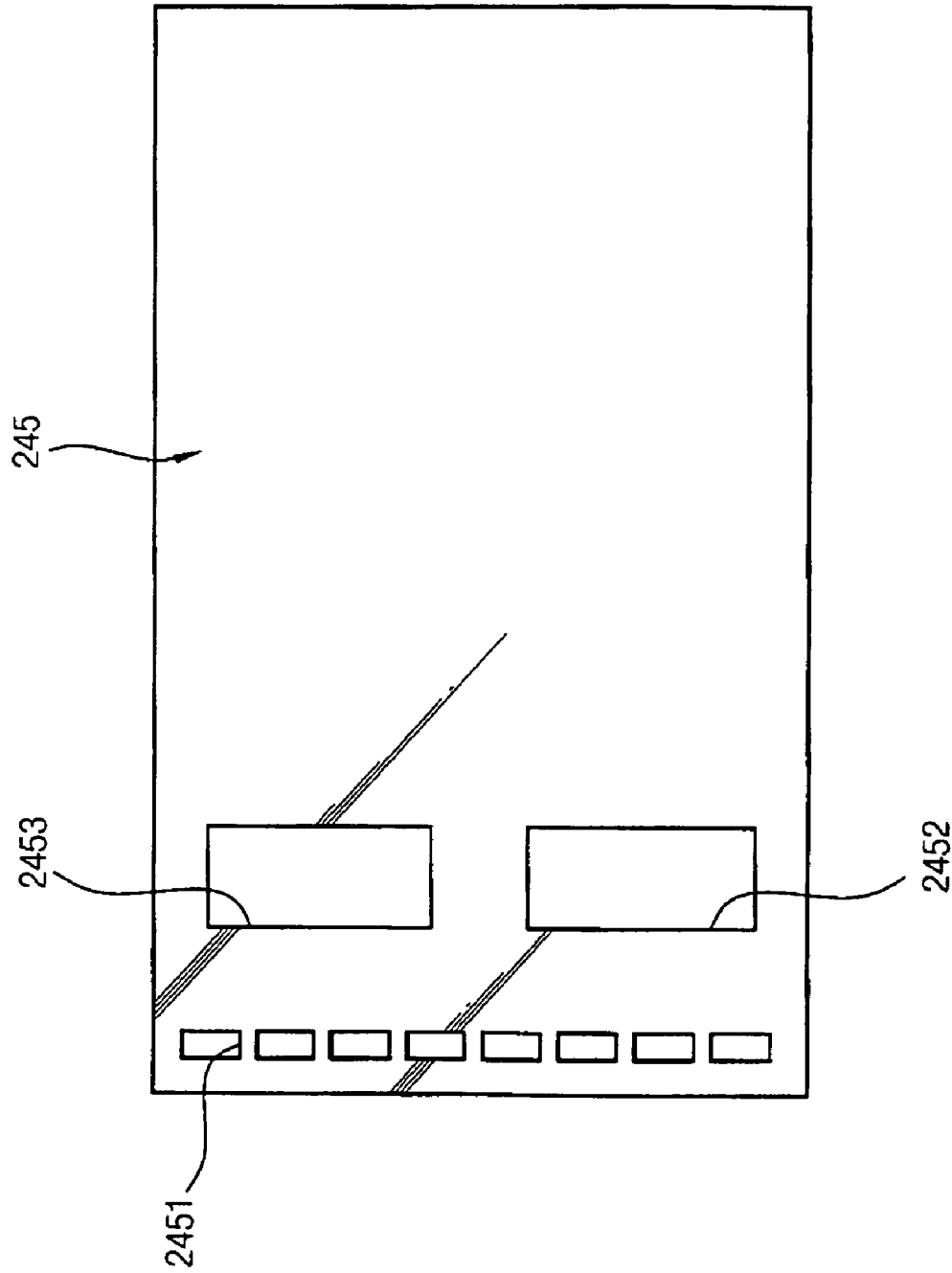
FIG. 4 is a plan view illustrating a bottom side of an exemplary reflection sheet in FIG. 1.

FIG. 4 is a plan view illustrating a bottom side of a light reflection sheet 245 in FIG. 1.

Referring to FIGS. 1, 3 and 4, the light-reflecting sheet 245 includes a light-reflecting material, so that a fist surface of the light-reflecting sheet 245 facing the lamp unit 210 reflects light generated by the lamp unit 210 toward the display panel 110. The light-reflecting sheet 245 includes the first combination hole 2451 to be combined with the second combination hole 291 of the receiving container 290, for fixing the lamp holder 220 relative to the receiving container 290. The first combination hole 2451 passes from a first surface of the light-reflecting sheet 245, to a second surface of the light-reflecting sheet 245, where the second surface of the light-reflecting sheet 245 faces the bottom plate of the receiving container 290. While the first combination hole 2451 is demonstrated at one side of the light-reflecting sheet 245, it should be understood that it may also be positioned adjacent an opposite side of the light reflecting sheet 245 for combining with the arrangement of lamp holders 220. The light-reflecting sheet 245 further comprises light-blocking members 2452 and 2453 positioned on the second surface of the light-reflecting sheet 245. The light-blocking members 2452 and 2453 are disposed at a region corresponding to the opening portions 292 and 293 of the receiving container 290 in order to block light that is leaked through the opening portions 292 and 293.

The light-blocking members 2452 and 2453 include, for example, a polyester film having carbon, polyethylene terephthalate ("PET"), etc., so that light may not pass through the light-blocking members 2452 and 2453. The light-blocking members 2452 and 2453 are attached to the light-reflecting sheet 245 by an adhesive. The light-blocking members 2452 and 2453 have a thickness in a range of from about 25 µm to about 188 µm for thickness uniformity. An area of the light-blocking members 2452 and 2453 is greater than an area of the opening portions 292 and 293 to ensure complete light blockage.

Figure 5:
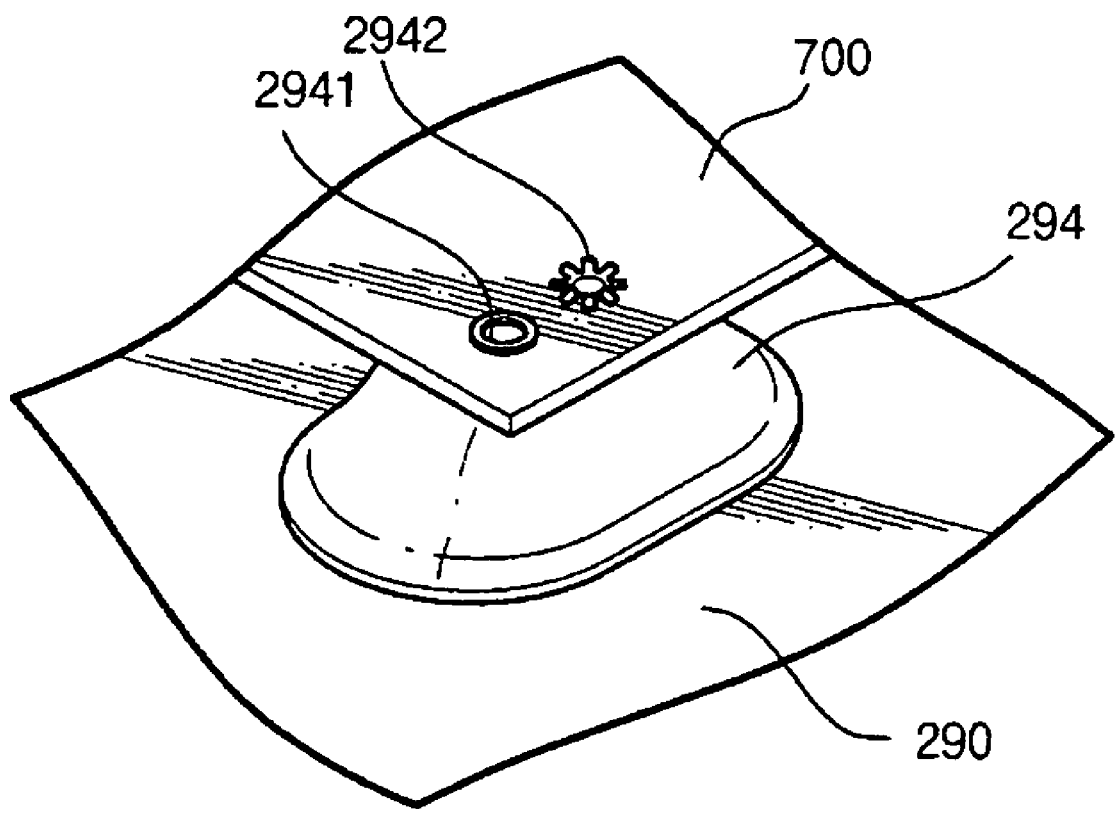
FIG. 5 is a perspective view illustrating a combination of the exemplary receiving container and an exemplary inverter in FIG. 1.

FIG. 5 is a perspective view illustrating a combination of the receiving container 290 and the inverter 700 in FIG. 1.

Referring to FIGS. 1, 3 and 5, the inverter 700 applies a driving signal to the lamp unit 210. The inverter 700 may be formed on a printed circuit board ("PCB"). The protruding portion 294 formed at a backside of the receiving container 290 supports the inverter 700 and is combined with the inverter 700 as shown. The bottom plate of the receiving container 290 includes a first surface facing the light reflecting sheet 245, and a second surface facing the inverter 700. Thus, the protruding portion 294 is formed on the second surface of the bottom plate of the receiving container 290. A plurality of protruding portions 294 may be provided for adequately supporting the inverter 700 and may be distributed at varying locations of the second surface of the bottom plate of the receiving container 290. The protruding portions 294 may be equally sized, or may vary in size and shape as necessary.

Each protruding portion 294 includes a first end attached to the second surface of the receiving container 290, and a second end. The second end of the protruding portion 294 includes a guide protrusion 2941 and a combination portion 2942. The guide protrusion 2941 guides the inverter 700, and the inverter 700 is combined with the protruding portion 294 through the combination portion 2942. The inverter 700 includes holes corresponding to the guide protrusion 2941 and the combination portion 2942, respectively. The inverter 700 is combined with the receiving container 290 through the holes. That is, the guide protrusion 2941 may be aligned with one hole in the inverter 700, and the combination portion 2942 may be aligned with another hole in the inverter 700. The combination portion 2942 may include any sort of attachment feature such as, but not limited to, flanges, screws, covers, etc., that assist the combination portion 2942 in being combined with the inverter 700 for preventing the inverter 700 from moving relative to the receiving container 290. In the illustrated embodiment, the combination portion 2942 includes a hole for receiving a screw as will be further described below.

Figure 6:
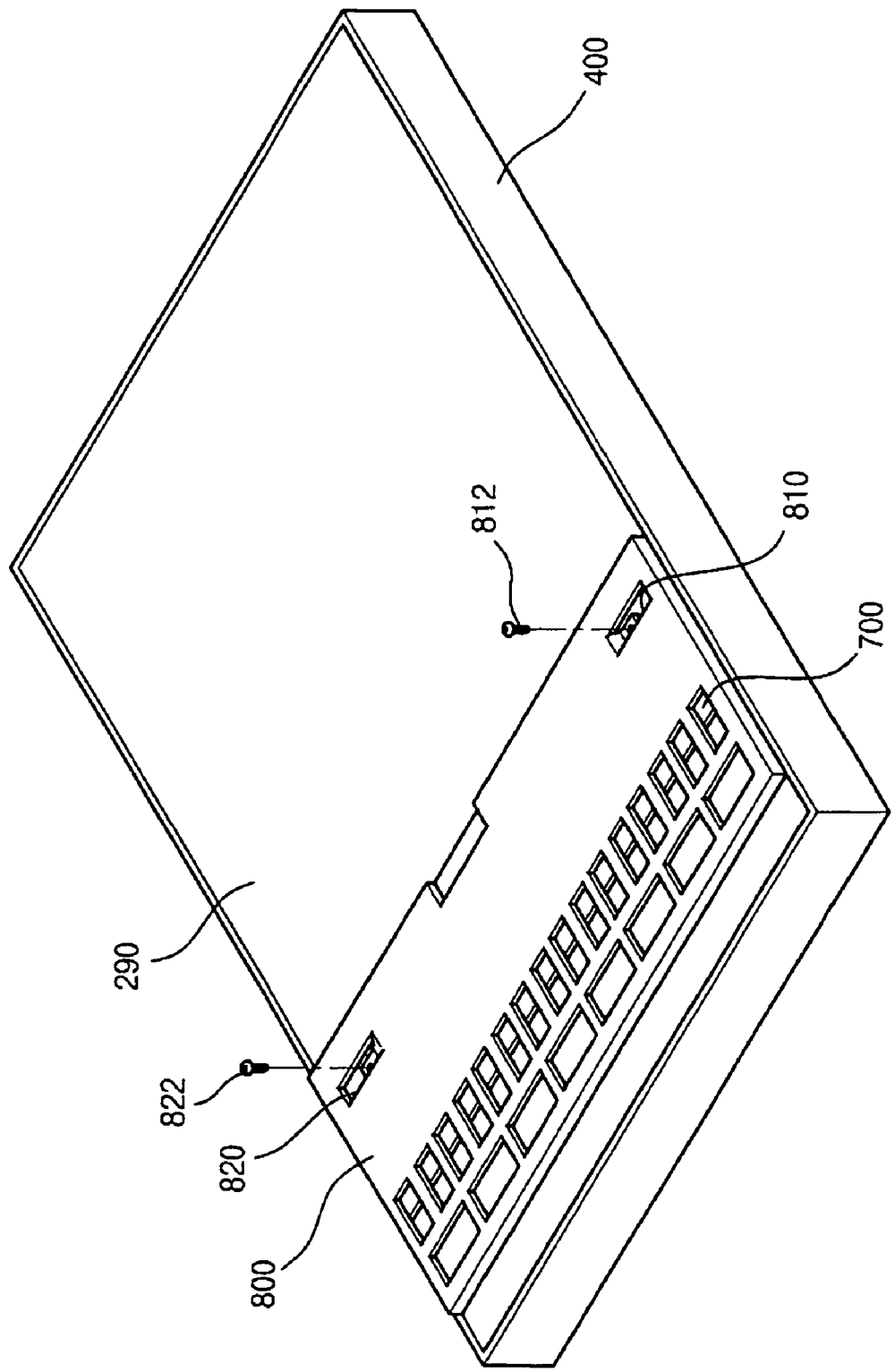
FIG. 6 is a perspective view illustrating a combination of an exemplary inverter and an exemplary protection case in FIG. 1.

FIG. 6 is a perspective view illustrating a combination of an inverter 700 and a protection case in FIG. 1.

Referring to FIGS. 1, 5 and 6, the inverter-protecting member 800 includes metal to block electromagnetic interference ("EMI") applied to the inverter 700. The inverter-protecting member 800 includes a first screw hole 810 and a second screw hole 820 for allowing a screw inserted therethrough to combine the inverter 700 and the receiving container 290.

The inverter 700 is guided by the guide protrusion 2941 formed at a backside of the receiving container 290, and a first screw 812 and a second screw 822 pass through the first and second screw holes 810 and 820, respectively, to fasten the inverter protecting member 800 and the inverter 700 to the receiving container 290. The screws 812, 822 may pass through the hole of the combination portion 2942 of the protruding portion 294. Thus, the screws 812, 822 combine the inverter-protecting member 800 to the inverter 700 to the protruding potion 294 of the receiving container 290.

Figure 7A:
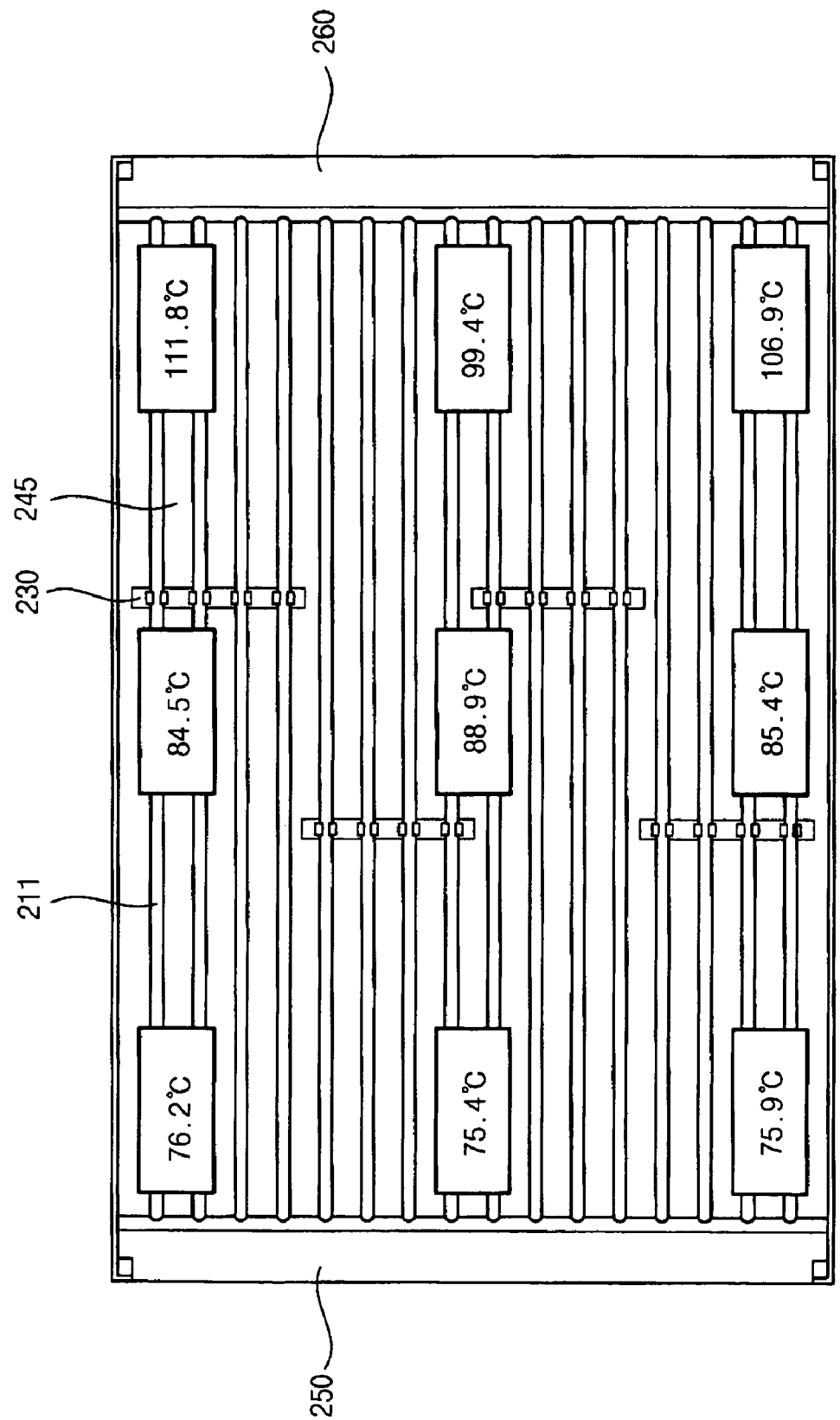

FIGS. 7A and 7B are plan views illustrating surface temperatures measured on a conventional backlight assembly and a backlight assembly employing an opening portion and a light-blocking member according to the above described embodiments, respectively. The receiving container of the backlight assembly in FIG. 7B includes the opening portions 292 and 293, and the light-blocking members 2452 and 2453 including polyethylene terephthalate ("PET") having a thickness of about 0.05 mm.

Referring to FIG. 7A, a surface temperature is measured to be about 76.2° C., 75.4° C. and 75.9° C. at first end portions adjacent the first side mold frame 250 of a conventional backlight assembly having no opening portion and no light-blocking member, to be about 84.5° C., 88.9° C. and 85.4° C. at center portions of the conventional backlight assembly, and to be about 111.8° C., 99.4° C. and 106.9° C. at second end portions adjacent the second side mold frame 260 of the conventional backlight assembly.

Referring to FIG. 7B, a surface temperature of the backlight assembly 200 is measured to be about 71.5° C., 71.5° C. and 71.7° C. at the first end portions adjacent the first side mold frame 250 of a backlight assembly 200 having the opening portions 292 and 293 and the light-blocking members 2452 and 2453, to be about 80.3° C., 81.2° C. and 85.8° C. at the center portions of the backlight assembly 200, and to be about 101.6° C., 98.8° C. and 105.9° C. at the second end portions adjacent the second side mold frame 260 of the backlight assembly 200.

Therefore, when a backlight assembly, such as backlight assembly 200, employs the opening portions 292 and 293 and the light-blocking members 2452 and 2453, a surface temperature is lowered by about 4° C. to about 10° C.

According to the embodiments described herein, the receiving container 290 includes the opening portion 292, 293 to dissipate heat generated from the lamp unit 210, so that display quality of the display unit 100 is enhanced.

Furthermore, the light-blocking member 2452, 2453 is formed at the light-reflecting sheet 245 to prevent the light from leaking.

The protruding portion 294 of the receiving container 290 spaces the inverter 700 apart from the receiving container 290 to dissipate heat by using convection. The inverter 700 is spaced from the receiving container 290 by a distance substantially the same as a distance from a first end of the protruding portion 294 to a second end of the protruding portion 294.

Having described the exemplary embodiments of the present invention and its advantages, it is noted that various changes, substitutions and alterations can be made herein without departing from the spirit and scope of the invention as defined by appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A display device comprising:
a display panel that displays an image on a first face of the display panel;
a backlight assembly that provides the display panel with light, the backlight assembly including a light source, an optical sheet disposed adjacent a first area of the light source and a light-reflecting sheet disposed adjacent a second area of the light source, wherein the light-reflecting sheet includes a first surface facing the light source and a second surface opposite the first surface;
a receiving container including a bottom plate having an opening portion arranged for dissipating heat from the light source, and a sidewall extended from edge portions of the bottom plate defining a receiving space for receiving the display panel and the backlight assembly; and
a light-blocking member disposed at the second surface of the light-reflecting sheet.

2. The display device of claim 1, wherein the light-blocking member is disposed at a region corresponding to the opening portion of the receiving container.

3. The display device of claim 2, wherein the light-blocking member is larger than the opening portion.

4. The display device of claim 2, wherein the light-blocking member has a thickness within a range from about 25 µm to about 188 µm.

5. The display device of claim 2, wherein the light-blocking member comprises polyester having carbon.

6. The display device of claim 5, wherein the light-blocking member is attached to the second surface of the light-reflecting sheet by an adhesive.

7. The display device of claim 2, wherein the light-blocking member comprises polyethylene terephthalate.

8. The display device of claim 7, wherein the light-blocking member is attached to the second surface of the light-reflecting sheet by an adhesive.

9. The display device of claim 2, wherein the light source includes a lamp.

10. The display device of claim 9, further comprising a light guide plate guiding light generated by the lamp.

11. The display device of claim 9, wherein the light source includes a plurality of lamps arranged in parallel with each other and disposed adjacent a second face of the display panel.

12. The display device of claim 11, where each of the lamps has a U-shape.

13. The display device of claim 2, wherein the light source includes a light-emitting diode.

14. The display device of claim 2, further comprising an inverter that applies a driving signal to the light source.

15. The display device of claim 14, wherein the inverter is disposed adjacent a region corresponding to the opening portion.

16. The display device of claim 14, wherein a first side of the receiving container faces the receiving space, and wherein the receiving container comprises a protruding portion formed at a second side of the receiving container, and the inverter is combined with the receiving container through the protruding portion.

17. The display device of claim 16, wherein the protruding portion has a hole, and the inverter is combined with the receiving container through an insertion of a screw through the inverter and into the hole.

18. The display device of claim 17, wherein the protruding portion further comprises a protrusion for guiding the inverter.

19. A display device comprising:
a display panel for displaying an image;
a backlight assembly including a light source and a light-reflecting sheet;
a receiving container for defining a receiving space for receiving the backlight assembly, the receiving container having a bottom plate; and
a board positioned in a region corresponding to at least one opening portion in the bottom plate of the receiving container, the board being spaced apart from the bottom plate for enhancing heat dissipation due to convection,
wherein at least the bottom plate includes a heat-dissipating member from the light source away from the display panel, and the heat-dissipating member includes the at least one opening potion formed in the bottom plate of the receiving container.

20. The display device of claim 19, wherein the board is an inverter for applying a driving signal to the light source, and wherein the inverter is spaced apart from and attached to the bottom plate by a protruding portion extending from the bottom plate.

21. The display device of claim 19, further comprising a light reflecting sheet positioned between the light source and the receiving container, wherein the heat-dissipating member further includes at least one light blocking member positioned on a surface of the light reflecting sheet, wherein the at least one light blocking member faces the at least one opening portion.

22. A method for protecting a display panel from deterioration due to heat from a light source, the method comprising:

providing a light source within a receiving container;

providing an opening portion in the receiving container, wherein heat from the light source passes through the opening portion;

placing a board outside the receiving container and adjacent the opening portion;

spacing the board from a bottom plate of the receiving container; and, convecting heat away from the display panel through a space created between the board and the bottom plate.

23. The method of claim 22, further comprising arranging a light-reflecting sheet between the light source and the receiving container; and, affixing a light-blocking member on the light reflecting sheet and adjacent the opening portion.

24. The method of claim 22, wherein placing a board outside the receiving container comprises placing an inverter outside the receiving container, and wherein spacing the board from the bottom plate of the receiving container comprises attaching the inverter to a protruding portion extending from the bottom plate.

* * * * *